(12) United States Patent
Li

(10) Patent No.: US 6,571,369 B1
(45) Date of Patent: May 27, 2003

(54) ENCODING IN A COMMUNICATION SYSTEM

(75) Inventor: Jifeng Li, Kanagawa (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/377,456

(22) Filed: Aug. 19, 1999

(30) Foreign Application Priority Data

Aug. 19, 1998 (JP) ............................................. 10-232579

(51) Int. Cl.$^7$ ............................................. H03M 13/03
(52) U.S. Cl. ...................................................... 714/792
(58) Field of Search ................................. 714/792, 790, 714/786, 755; 375/265, 259

(56) References Cited

U.S. PATENT DOCUMENTS

| 5,406,570 A | | 4/1995 | Berrou et al. |
| 5,446,747 A | | 8/1995 | Berrou |
| 5,978,365 A | * | 11/1999 | Yi ............................... 370/331 |
| 6,023,783 A | * | 2/2000 | Divsalar et al. ............ 375/262 |
| 6,088,387 A | * | 7/2000 | Gelblum et al. ............ 375/222 |

FOREIGN PATENT DOCUMENTS

| EP | 0 749 211 A2 | 12/1996 |
| EP | 0 820 159 A2 | 1/1998 |

OTHER PUBLICATIONS

Keihou RI—"Sailing Toward Shannon Capacity" Data to be used for Discussion of Theses of the Graduate School of Tokyo University, Nov. 22, 1996.

Berrou C et al. Near Shannon Limit Error–Correcting Coding and Decoding: Turbo–Codes(1), May 23, 1993 pp. 1067–1070.

Berrour C et al., "Les Turbo–Codes:UNE Nouvelle Approche Du Codage", 1997 pp. 68–74.

Divsalard, et al., "Multiple Turbo Codes", Nov. 6, 1995 pp.279–285.

* cited by examiner

Primary Examiner—Albert Decady
Assistant Examiner—Esaw Abraham
(74) Attorney, Agent, or Firm—Katten Muchin Zavis Rosenman

(57) ABSTRACT

The present invention provides an optimum combinational configuration of an encoder and an interleaver of an encoding apparatus with the characteristics of a fading channel taken into account. Signals $x_k$ and $y_{1k}$ transmitted to a multiplexer are interleaved and input to a multiplexer. This enables the channel interleaver required between an encoder and multiplexer of a conventional apparatus to be removed. The encoding apparatus includes first and second encoders, first and second interleavers and a multiplexer which multiplexes an output from the first interleaving with an output from the second encoder. Conventionally, a channel interleaver has been provided as a countermeasure against fading. However, in this case, the delay of the channel interleaver is extended to reduce the bit error rate. Therefore, the channel interleaver is removed, and the interleaver is connected in parallel in the encoder so that the delay allowed for one interleaver is extended, thereby improving the transmission characteristics.

14 Claims, 10 Drawing Sheets

| 1 | 2 | 3 | 4 | 5 |
|---|---|---|---|---|
| 6 | 7 | 8 | 9 | 10 |
| 11 | 12 | 13 | 14 | 15 |
| 16 | 17 | 18 | 19 | 20 |
| 21 | 22 | 23 | 24 | 25 |
| ⋮ | ⋮ | ⋮ | ⋮ | ⋮ |
|  |  |  | TAIL-BIT |  |

FIG.8
(PRIOR ART)

ENCODING IN A COMMUNICATION SYSTEM

BACKGROUND OF THE INVENTION

The present invention relates to an encoding apparatus for improving transmission characteristics in a fading channel of a communication system.

Various research and developments have occurred in order to realize multimedia communication for practical use. In particular, developments have been made in mobile terminal communication systems, which have become very popular for transmitting information including data and images, etc. as well as voice information for practical mobile terminal communications.

In such mobile terminal communications, one such system is a CDMA (code division multiple access) system. However, a crucial problem in such mobile terminal communications is that the mobile terminal is not fixed in place. Therefore, a system capable of guaranteeing satisfactory communications is required.

For example, when a mobile terminal is used between high buildings, etc., an electric wave transmitted from a base station to the mobile terminal is received by the mobile terminal after being reflected by various obstacles. Such attenuation is referred to as multi-path fading. Through the multi-path fading, the power of an electric wave received by a mobile terminal frequently changes.

When the electric wave is received in a poor electric power state, the bit error rate of data received can become considerably high. When bit errors occur in an uniformly distributed manner, the errors can be easily corrected. However, if the bit errors occur in bursts, it is more difficult to correct such errors.

Especially, in the next-generation mobile terminal communication system, a high-speed and high-quality transmission is indispensable. To attain such quality, a turbo-code is considered to be a probable candidate for an effective error correction code. Using the turbo-code, the transmission characteristic of the communications system can be significantly improved.

FIG. 6 shows an example of a transmitter for a conventional DS-CDMA system. When an input signal of data and/or voice is input, it is received by a turbo-coder 61, described later, in which a turbo-code is used. In the turbo-encoder 61, the data signal and voice signal are encoded into turbo-codes to put such signals in a correctable state.

The encoded signals are then input to a channel interleaver 62, which is provided to prevent the deterioration in transmission characteristic by the error burst through fading. The channel interleaver 62 randomizes the bit array of input signals and outputs the result.

The signals output from the channel interleaver 62 are then input to a multiplexing unit 64 along with a pilot signal 63 for synchronization of the system. The multiplexing unit 64 multiplexes the signals from the channel interleaver 62 and then inputs the multiplexed output to a modulator 65 (for performing a QPSK modulation in FIG. 6). The signals modulated by the QPSK modulator 65 are transmitted to a spreading unit 66, for processing by spread spectrum modulation, and then transmitted through an antenna 67.

FIG. 7 shows an example of conventional turbo-encoder. A data signal u input to the encoder shown in FIG. 7 is branched. One branched signal is transmitted to a multiplexer 73, and the other to a convolutional coder 70-1 and an interleaver 71. In the convolutional coder 70-1, a convolutional code is generated using a signal string of input data signals u. In the configuration of FIG. 7, an input signal $x_k$ is added to a one-bit delay value $x_{k-1}$ and a two-bit value $x_{k-2}$ by an adder. Further, the result is also added again to the 2-bit delay value $x_{k-2}$, and input as a convolutional code $y_{1k}$ to a puncturing unit 72.

Further, the data signal transmitted to the interleaver 71 is temporarily entered in a matrix, and then read in an order different from the order in which it is written to the matrix. Thus, the data signal output from the interleaver 71 is represented as a bit array different from bit array of the original data signal u. Therefore, after the bit sequence of the data signal is changed at random, the signal is input to a convolutional coder 70-2.

In the convolutional coder 70-2, a similar process as performed in the convolutional coder 70-1 is performed, and a convolutional code is generated. However, a convolutional code output from the convolutional coder 70-2 is obtained by encoding a data signal having a bit sequence randomized by the interleaver 71. Therefore, it is input to the puncturing unit 72 as a convolutional code $y_{2k}$ different from the code output from the convolutional coder 70-1.

The puncturing unit 72 switches the code $y_{1k}$ from the convolutional coder 70-1 and the code $y_{2k}$ from the convolutional coder 70-2 using a predetermined pattern. The switched codes are then input to the multiplexer 73. A typical puncturing method is to alternately switch the code $y_{1k}$ and the code $y_{2k}$. However, the switching of the codes do not necessarily have to be alternated. The user can appropriately determine the switching mode.

The signal $x_k$ and a signal from the puncturing unit 72 are multiplexed by the multiplexer 73 and the result is then output as an encoded signal. The encoded signal output from the multiplexer 73 is interleaved by an interleaver 62. In other words, the encoded signal is read to a matrix, read out at random, and then output. The interleaver 71 of FIG. 7 is provided to make the code $y_{2k}$ from the convolutional coder 70-2 different then the code $y_{1k}$ from the convolutional coder 70-1. The interleaver 71 and the convolutional coder 70-2 are assumed to form an encoder. Further, the interleaver 62 is provided to prevent bursts that occur in a transmission signal.

Since a transmitted signal is obtained by the interleaver 62 randomizing a bit array of the signal, an error burst arising in the signal that could span a plurality of bits is distributed. The error burst can be distributed by a receiving side interleaver 74 for distributing the error into scattered bit errors. This is desirable since a plurality of scattered bit errors can be more easily corrected than an error burst. As a result, an error code rate due to error bursts is reduced.

FIG. 8 illustrates an example of a basic interleaving process. An interleaver includes a plurality of memory units for sequentially storing input data. As shown in FIG. 8, an input data signal is sequentially written bit by bit from the leading bit. For example, the row direction as indicated by the numbers in FIG. 8. After a predetermined length of the data signal has been read, the data signal is then read out, for example, in a column direction. Thus, the bits of the data signal is output randomly. It is not always necessary to read the columns sequentially from the left. It may be better to select and read a column randomly to furthermore randomize the data signals to be output.

In order to randomize a data signal, it is desirable that a larger number of data signals are read and output. Thus, the number of signals that can be changed in output order increases. For example, a packet of data signals can be read and interleaved. In this case, the packet is followed by a tail bit, and the tail bit may or may not be interleaved. When the tail bit is interleaved, it can be similarly read with the other signals forming a matrix as shown in FIG. 8. Unless the tail bit is interleaved, the signals are read from the positions other than those where the tail bit is stored. After all the other data signals have been read, the tail bit is then read in the order it was written, and then added at the end of the output signal.

The interleaver first stores data signals in memory and then reads the data signals out later. Thus, the larger number of data signals to be read, the longer the delay becomes. As a result, when the interleaving process is performed by the interleaver 71 as shown in FIG. 7, the output from the convolutional coder 70-2 is delayed by the amount of the delay of the interleaver 71. Therefore, shift registers, etc. are provided to adjust the output from other encoders, or the timing to directly output the data signal.

Since all of the signals are delayed in the process of interleaving by the interleaver 62 of FIG. 7, there is no need for designing a configuration to adjust the timing with the other signals. However, to more efficiently perform the interleaving process, a larger number of data signals are stored, thereby causing a longer delay.

FIG. 9 shows an example of a conventional decoder. The decoders shown in FIG. 9 are serially connected for sequential decoding. The signal decoded in these decoders is encoded by the encoder shown in FIG. 7. Refer to the operations of these decoders described in the U.S. Pat. No. 5,446,747, which is hereby incorporated by reference.

FIG. 10 shows an image of received electric power when a fading channel is used. In the case of a mobile terminal communications, etc., an error burst may occur due to the influence of fading. In FIG. 10, the receiving power fluctuates greatly with the lapse of time. When the receiving power is high, there is a strong possibility that a signal is correctly received. When the receiving power is low, there is a strong possibility that a large number of error bursts will occur. In the worst case, data cannot be received at all. Normally, to correct bit errors occurring during the transmission of data signals, an error correction encoding process is performed. However, since the conventional error correction decoder is significantly influenced by an error burst, an interleaver is often used to randomize error bursts. That is, the interleaver 62 shown in FIG. 7 is provided after the error correction encoder. The above-described encoder is referred to as a turbo-encoder, and is capable of correcting errors using a well known encoding method.

In the above-described conventional technology, a turbo-encoding process and a channel interleaving process are independently performed. Thus, the error correction decoding process is not efficiently performed. Furthermore, since an interleaver is also provided in the turbo-coder, the delay by the encoding and interleaving processes is about 2N (in this case, N refers to the length of the signal stored in the interleaver). In other words, in the interleaving process, a delay of N occurs in writing a signal to memory having a signal length of N.

Furthermore, another delay of N occurs when reading a signal having the signal length of N is read from the memory. In this case, it is necessary to furthermore improve the transmission characteristic (bit error rate, frame error rate) for a given delay of 2N. This problem is especially serious with services having high requirements, (data etc.).

SUMMARY OF THE INVENTION

An object of the present invention is to provide an optimum combination of an encoder and an interleaver by taking the characteristics of a fading channel into account.

These and other objects are met according to the present invention which comprises a first encoding unit for encoding an input signal, a first interleaver unit for interleaving the input signal and the output from the first encoding unit, a second interleaver unit for interleaving the input signal, a second encoding unit for encoding the output from the second interleaver unit and a multiplexing unit for multiplexing an output signal from the first interleaver unit with an output signal from the second encoding unit, and then transmitting the result.

The method according to the present invention also includes the steps of:

(a) Encoding an input signal.

(b) Interleaving the input signal and the signal encoded in step (a).

(c) Interleaving differently the input signal and then encode the signal differently interleaved in step (c). Further, multiplexing a signal obtained in step (b) with an output signal obtained in step (d), and transmitting the result.

The present invention as described above eliminates the channel interleaver required at the output of a conventional encoder in which signals are first multiplexed without an interleaving process and then collectively interleaved by a channel interleaver. According to the present invention, a signal that is multiplexed in the conventional apparatus is first interleaved, multiplexed with another encoded signal, and then transmitted. Therefore, a desired transmission characteristic is obtained by decreasing conventional delay time.

BRIEF DESCRIPTION OF THE DRAWINGS

FIG. 8 shows the basic concept of interleaving;

DETAILED DESCRIPTION

Figure 1:
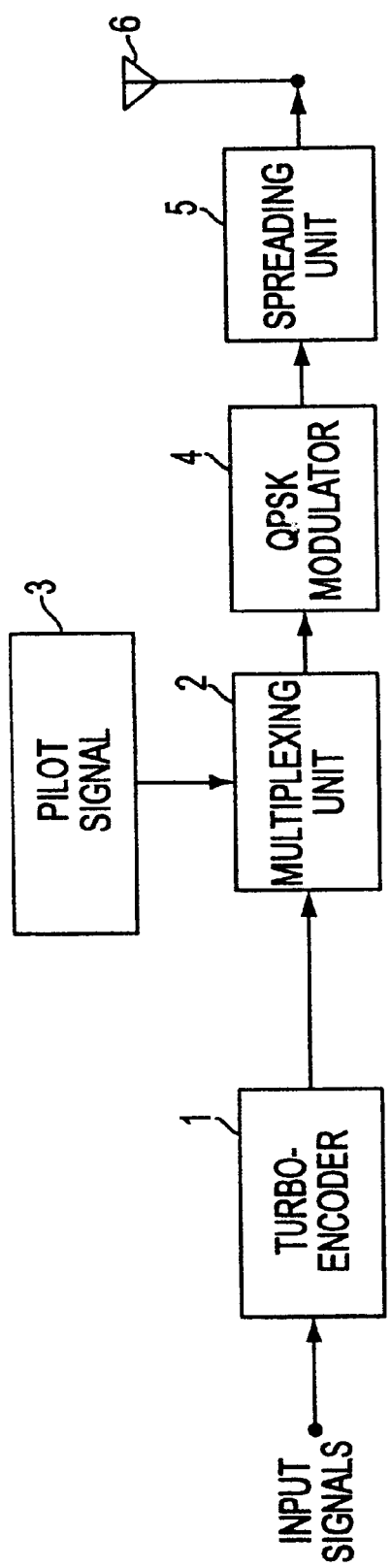
FIG. 1 shows a transmitter for a DS-CDMA system according to the present invention.

FIG. 1 shows one embodiment of a transmitter for a DS-CDMA system according to the present invention. According to the present invention, a turbo-encoder is designed to have a configuration different from that of the conventional encoder. The turbo-encoder 1 of the present invention eliminates the need for channel interleavers required at the output of a conventional decoder. The input data signals including voice signals, etc. are encoded by the turbo-coder 1 according to the present embodiment and then transmitted directly to a multiplexing unit 2. The multiplexing unit 2 multiplexes the encoded signal in synchronization with a pilot signal 3, and transmits the multiplexed signals to a QPSK modulator 4. The signal QPSK-modulated by a QPSK modulator 4 is spread-spectrum modulated by a spreading unit 5, and then transmitted through an antenna 6.

In turbo-coding using a Gaussian channel, the maximum decoding error rate of a turbo-code having the encoding rate (information factor) of ½ is obtained as follows.

$$P_b(e) \leq \frac{1}{N} \sum_{k=1}^{[N/2]} 2k \binom{2k}{k} \frac{H^{(2-2Z_{min})k}}{(1-H^{Z_{min}-2})^{2k}} \bigg|_{H=3^{-R_c E_b/N_0}}$$

Where $Z_{min}$ indicates the minimum weight of the error event parity check bit generated by an information sequence of weight 2, $E_b/N_o$ indicates the ratio of the signal energy to the interference power of a main signal and $R_c$ indicates a positive constant.

According to the above equation, the error rate characteristic relates to the length N of an interleaver (signal length stored in the interleaver). The larger the value of N, the smaller $P_b(e)$ becomes, which is referred to as an interleaver gain. A lower maximum decoding error rate or a smaller interleaver gain means that the worst value of the error rate becomes smaller, thereby improving the transmission characteristics.

According to the present invention, the following turbo-coder improves the transmission characteristics of a mobile terminal communications system.

Figure 2:
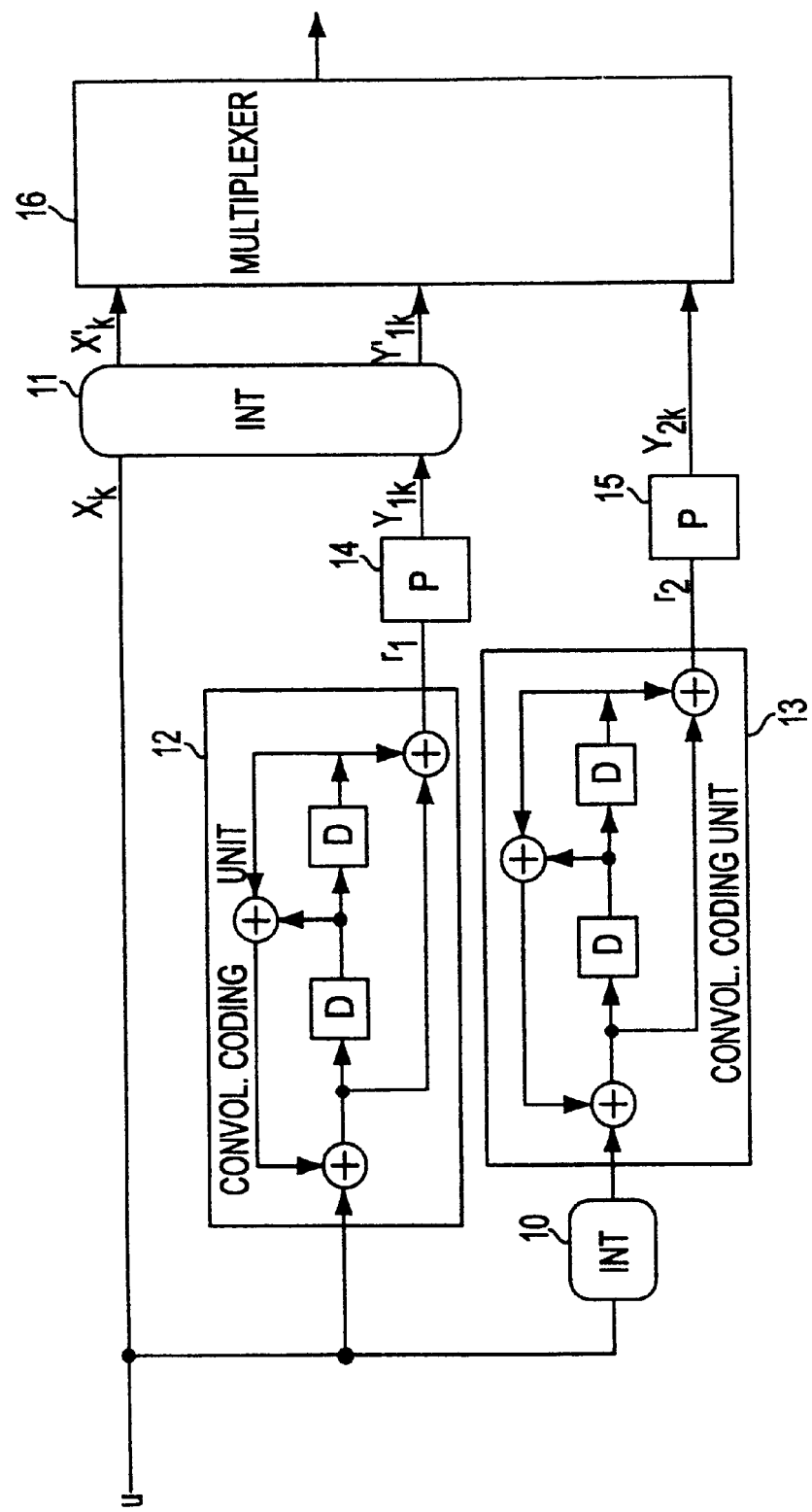
FIG. 2 shows a turbo-encoder according to the present embodiment.

FIG. 2 shows one embodiment of a turbo-coder according to the present invention. As can be seen, the output $x_k$ and $y_{1k}$ are interleaved. For example, the length of an interleaver 10 is 2N and the length of an interleaver 11 is 4N. Thus, the length of the interleaver 11 including the tail bit (length of v) is 4N+v. Therefore, the delay produced by the encoding process is approximately 2N if the read and write speed of the interleaver 11 is double the speed of the interleaver 10. However, the present invention is not limited to such a configuration.

The input data signal u is branched into a signal $x_k$, which is input to the interleaver 11, a convolutional coding unit 12 and the interleaver 10. The signal $r_1$ encoded by the convolutional coding unit 12 is input to a puncturing unit 14. Further, the signal input reaches a signal length N, which is then readout randomly and input to a convolutional coding unit 13. In the interleaver 10, a delay of 2N occurs when a signal having a signal length of N is written to the memory and then readout. The signal interleaved by the interleaver 10 is encoded by the convolutional coding unit 13 and input as an encoded signal r2 to a puncturing unit 15.

The puncturing units 14, 15 synchronously perform an operation of starting and stopping the outputting of signals. The pattern of determining whether or not the signal is output from the puncturing units 14, 15 can be a pattern of alternately outputting a signal. However, the present invention is not limited to this pattern. Although, a pattern effective for error correction should be selected.

The signal $y_{1k}$ transmitted from the puncturing unit 14 is input to the interleaver 11. Further, the signal $y_{2k}$ transmitted from the puncturing unit 15 is input to a multiplexer 16. Since the signals $x_k$ and $y_{1k}$ are input to the interleaver 11, it is necessary to read the signals $x_k$ and $y_{1k}$ by the signal length of N in order to interleave each signal by the signal length of the interleaver 10. The signals are then readout randomly in a mixed manner in order to obtain signals $x_k'$ and $y_{1k}'$. In this case, a 4N delay occurs. Thus, the reading and writing speed of the interleaver 11 is doubled in order to input to the multiplexer 16 the signal $y_{2k}$ having a 2N delay produced by the interleaver 10, and the signals $x_k'$ and $y_{1k}'$ having a 4N delay produced by the interleaver 11 at the same time. This is significant since it eliminates the need for another interleaver at the output of the multiplexer. Therefore, the delay induced by such an interleaver is eliminated. The multiplexer 16 then multiplexes the signals $x_k'$, $y_{1k}'$ and $y_{2k}$, and then transmits these multiplexed signals.

The interleavers 10, 11 can sequentially select whether or not the tail bit of an input signal is to be interleaved. As described above, if a packet of data signals are temporarily read to an interleaver and re-read at random, then the tail bit can be read in the same way as another signal. Alternately, the tail bit can be read as is without being read exclusively after all the other signals have been read and then added to the end of the interleaved signal. This can be easily realized by one of ordinary skill by appropriately controlling the read address of the memory forming part of the interleavers 10, 11.

With the configuration shown in FIG. 2, the channel interleaver is not provided after the multiplexer 16. However, a channel interleaver can be provided thereafter. In this case, a delay occurs through the channel interleaver, but the delay can be set within a range prescribed by the specification of the system. Therefore, both the advantages of the present embodiment and advantages of using the channel interleaver can be obtained.

Figure 3:
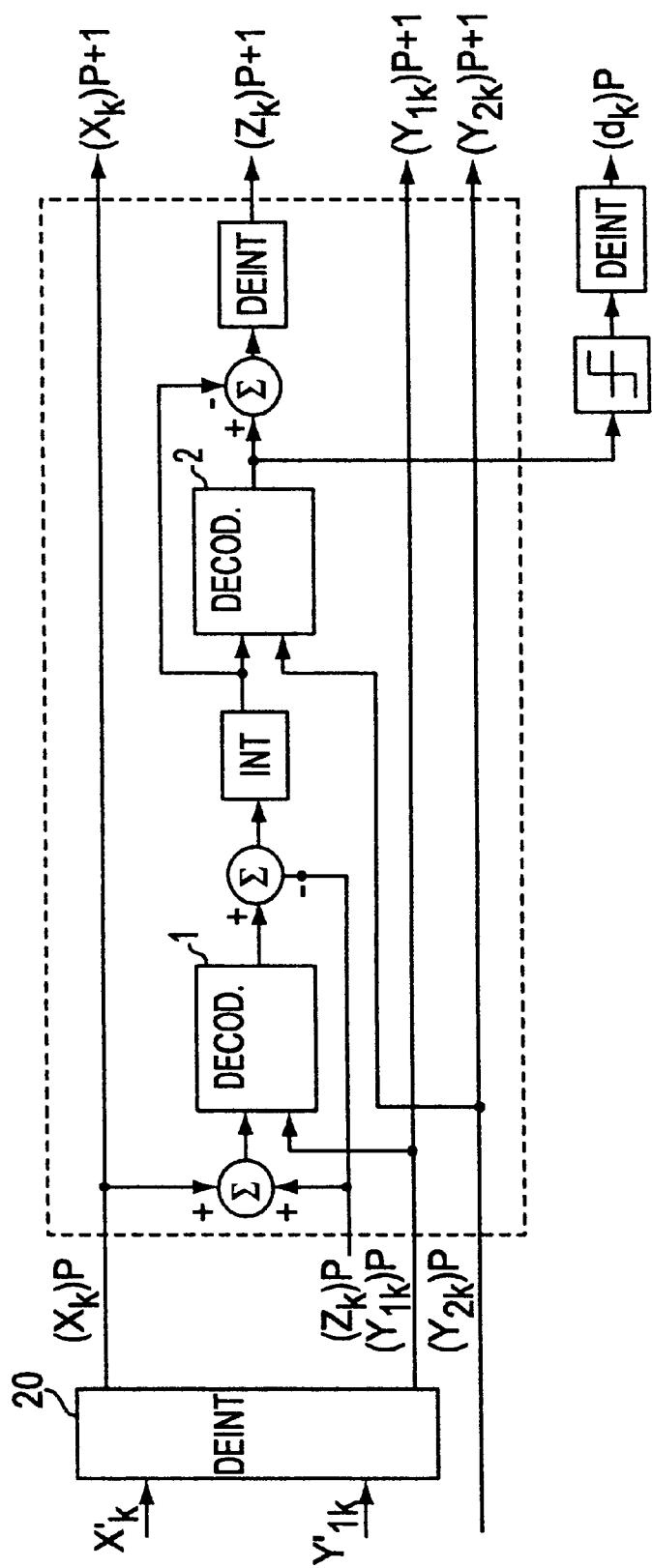
FIG. 3 shows one embodiment of a turbo-decoder according to the present invention.
Figure 9:
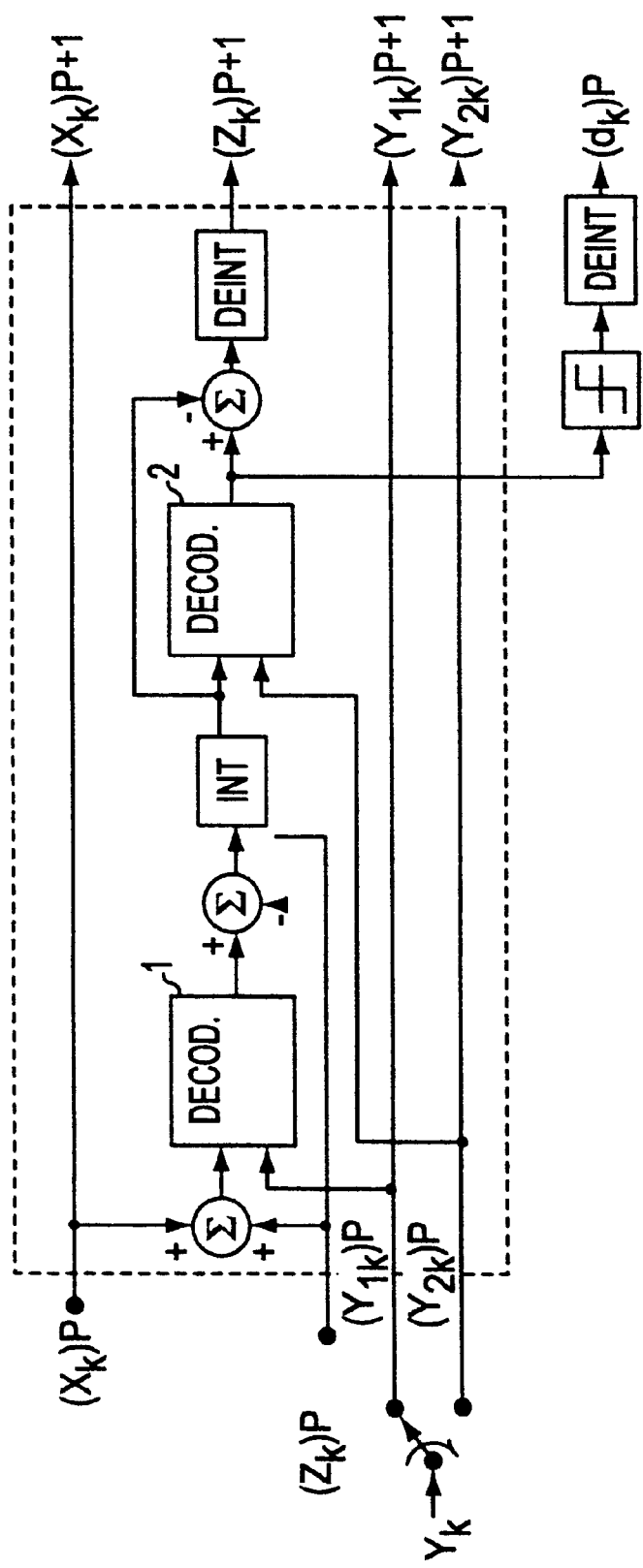
FIG. 9 shows an example of a conventional decoder.
Figure 10:
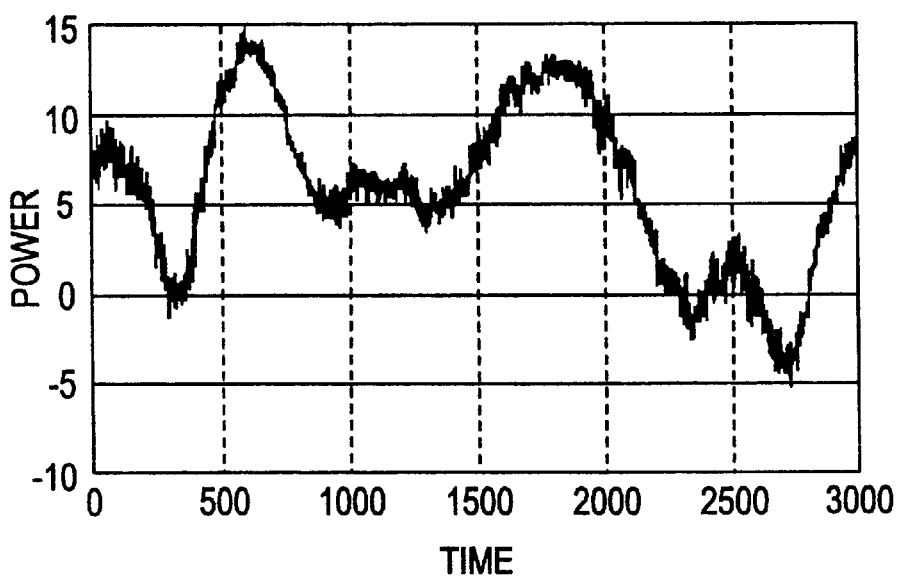
FIG. 10 shows the image of received electric power using a fading channel.

FIG. 3 shown one embodiment of the turbo-decoder according to the present invention. The configuration of the decoder shown in FIG. 3 is basically the same as that of the decoder shown in FIG. 9 except that a deinterleaver 20 is provided before the decoder. The deinterleaver 20 is provided to deinterleave the signals $x_k'$ and $y_{1k}'$ obtained after being interleaved on the encoder side. The operation of the decoder is practically the same as that shown in FIG. 9 except that the process is performed through the deinterleaver 20. Refer to the above reference patent publication for more practical operations.

If the present invention uses the same amount of delay as the conventional technology, then the bit error rate and the frame error rate of the system can be reduced. In other words, the bit error rate can be reduced by increasing the amount of signals to be interleaved. However, in this case, the interleaver causes a delay. Thus, if a larger number of signals are interleaved, a longer delay is generated. This means that the same amount of delay corresponds to the same number of interleaved signals. Therefore, according to the present embodiment, the bit rate can be reduced for the same number of interleaved signals.

In the DS-CDMA mobile terminal communication system according to the present invention, the effect of the interleaver is confirmed by simulation. Table 1 shows the conditions of the simulation.

| | |
|---|---|
| Chip rate | 4.096 Mcps |
| Information rate | 32 kbps |
| Process gain | 32 × 4 |
| Frame length | 10 ms |
| Channel coding | 2-dimensional turbo-code 7/5 code |
| Repeated decoding | APP soft input/soft output decoder, 8 repetitions |

| | |
|---|---|
| Modulation system | QPSK (Data), QPSK (Spreading) |
| Demodulation system | Synchronous detection by 1Q multiplexing pilot |
| Propagation model | Vehicular Model B ($f_d T_{slot} = 0.05$) |
| Transmission power control error | 2.3 dB |
| Diversity | 4 finger RAKE |

Figure 4:
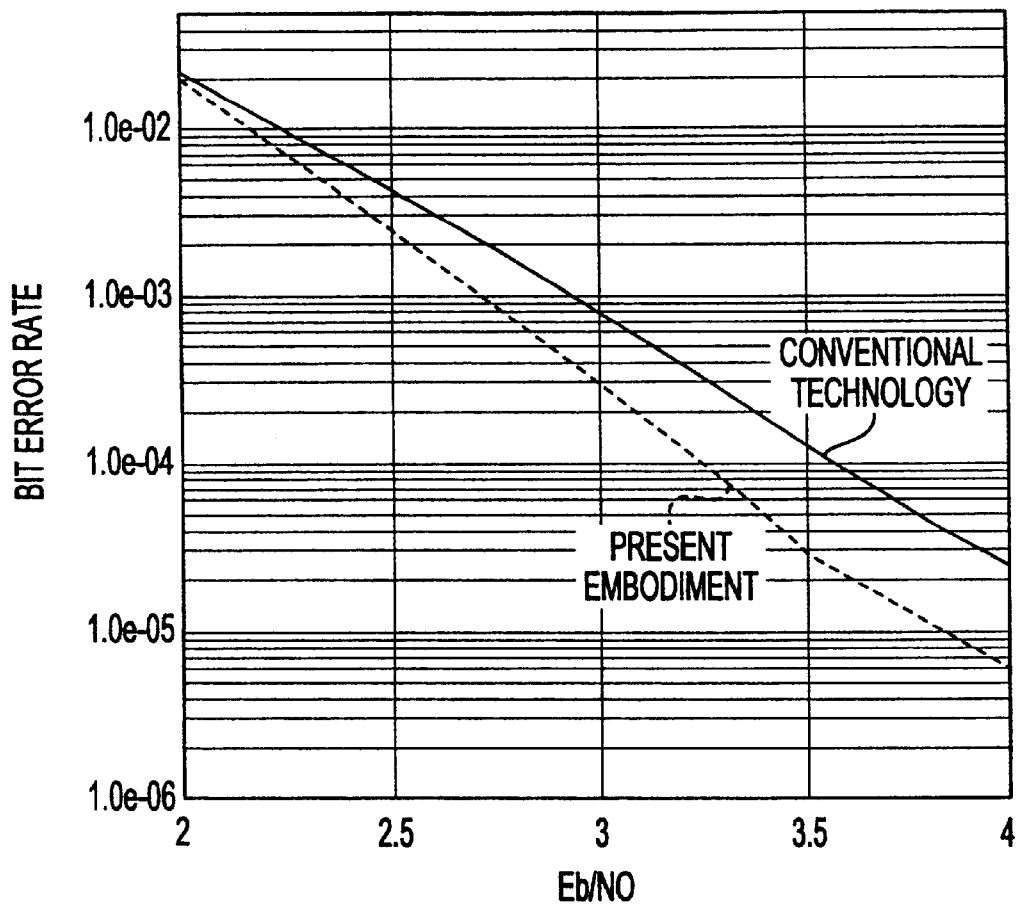
FIG. 4 shows a result of a simulation.

FIG. 4 shows a result of the above-described simulation. As can be seen, the bit error rate is reduced according to the present invention. The bit error rate according to the present invention is lower than that of the conventional technology in a wide range of "Eb/No" values.

Figure 5:
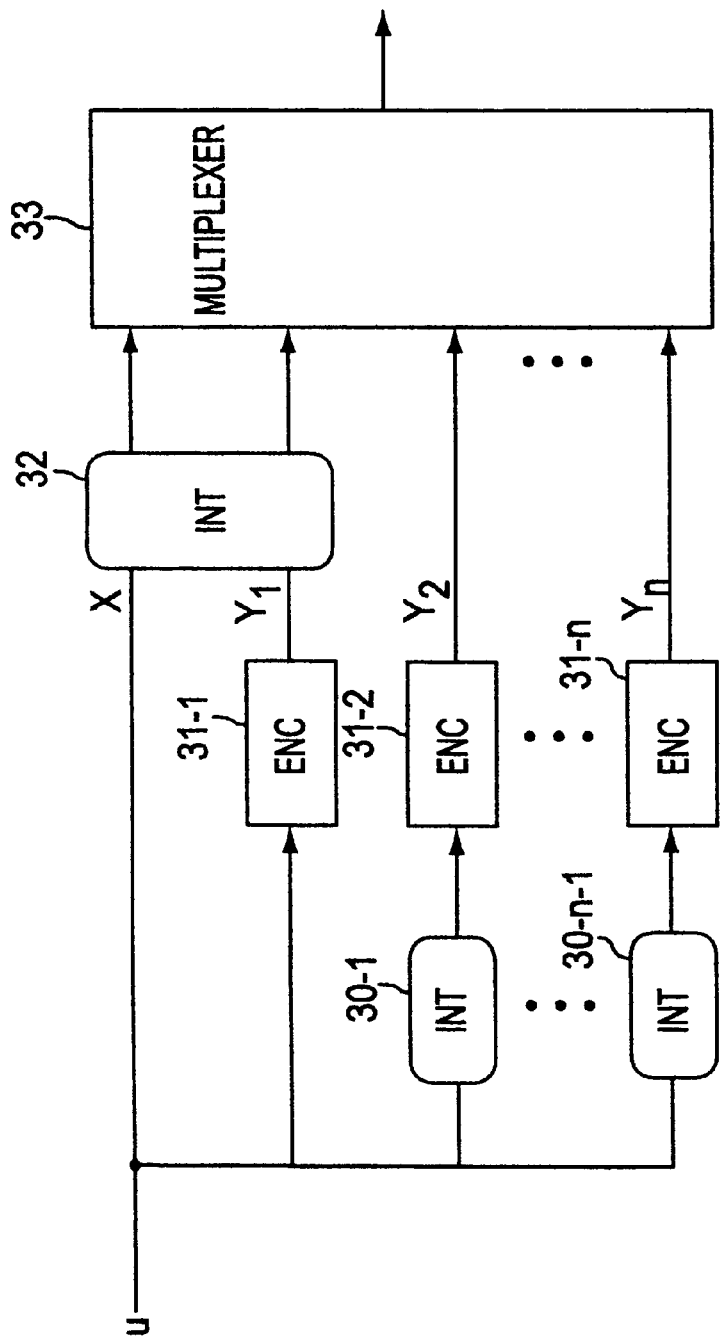
FIG. 5 shows a multidimensional turbo-encoder according to the present invention.
Figure 6:
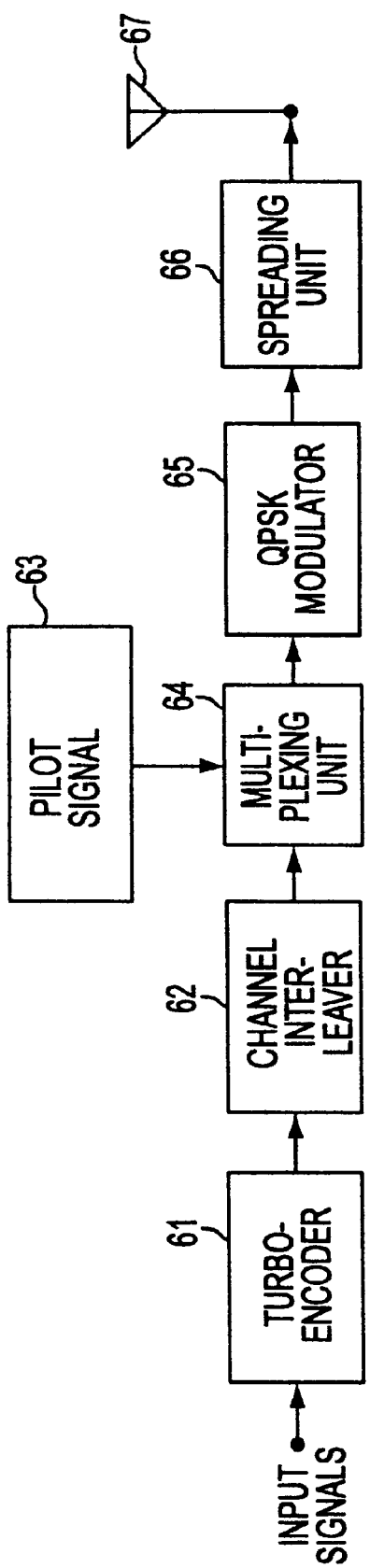
FIG. 6 shows an example of a transmitter for a conventional DS-CDMA system.
Figure 7:
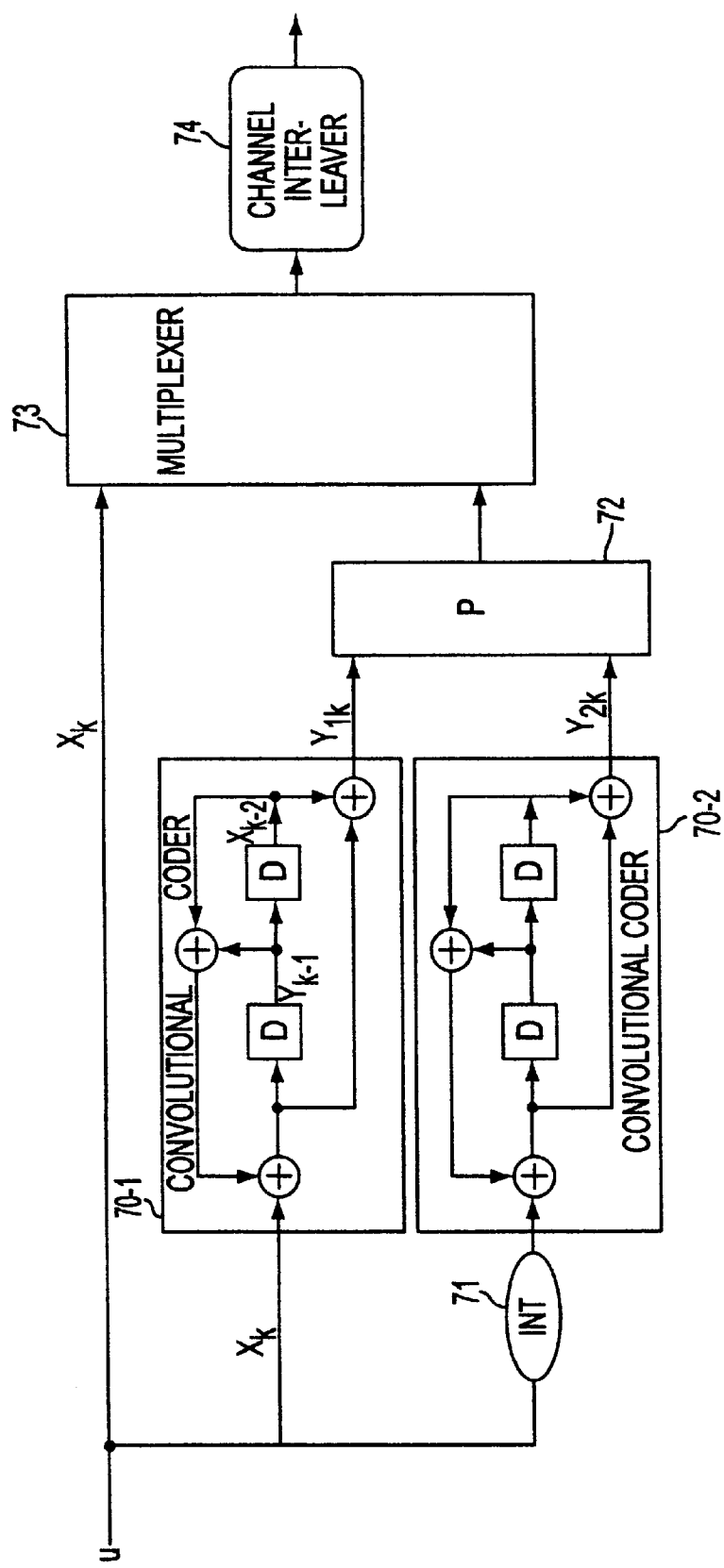
FIG. 7 shows an example of a conventional encoder.

FIG. 5 shows one embodiment of a multidimensional turbo-encoder according to the present invention. When two or more component encoding units are used, the interleaving process is performed on the output $x_k$ and $y_{1k}$, as the case shown in FIG. 2.

The signal u input to the encoder shown in FIG. 5 is branched. One signal x is directly input to the interleaver 32, and the other to an encoding unit (component encoding unit) 31-1 and interleavers 30-1 to 30-$n$-1. The signal $y_1$ encoded by the encoding unit 31-1 is input to an interleaver 32, interleaved after being mixed with the signal x and then input to a multiplexer 33.

Further, the signals input to the interleavers 30-1 to 30-$n$-1 are respectively interleaved and then input to encoders 31-2 to 31-$n$. The signals input to respective encoders 31-2 to 31-$n$ are treated to a predetermined process, encoded and then input to the multiplexer 33.

According to the present invention, the channel interleaver is removed from the output of the multiplexer 33 and the signals x and $y_1$ are input to the multiplexer 33 after being interleaved and then transmitted, thereby reducing the bit error rate. Assuming with the configuration of the conventional technology, the delay of a signal to be encoded after being interleaved is 2N and the delay of a channel interleaver is 2N. Thus, a total delay of 4N is generated. In contrast, according to the present invention and the above-described embodiment, the delay due to the channel interleaver is eliminated at the output of the multiplexer. Thus, the delay allowed for each interleaver 10, 11 can be increased to 4N, which is desirable. If the interleaver can include a number of signals to further improve the transmission characteristics with a larger number of interleavers, then the present embodiment or the above described embodiment can be configured to have a larger amount of delay for the interleaver than the conventional technology, thereby reducing the encoding error rate.

The encoder according to the present invention can improve the transmission characteristic of the system without extending the delay.

There has been disclosed heretofore the best embodiments of the invention presently contemplated. However, it is to be understood that various changes and modifications may be made without departing from the spirit of the invention.

What is claimed is:

1. An encoding apparatus for a mobile communication system, comprising:
 a first encoder encoding an input signal;
 a first interleaver interleaving the input signal and an output from said first encoder;
 a second interleaver interleaving the input signal;
 a second encoder encoding an input from said second interleaver; and
 a multiplexer multiplexing an output signal from said first interleaver with an output signal from said second encoder.

2. The apparatus according to claim 1, wherein said first and second encoders perform a turbo-encoding process.

3. The apparatus of claim 2, wherein plural combination of said second encoders and said second interleavers are provided.

4. The apparatus according to claim 1, which further includes a puncturing unit coupled between the output of said first encoder and an input of said first interleaver.

5. The apparatus of claim 1, which further includes a second puncturing unit coupled between an output of said second encoder and said multiplexer.

6. The apparatus of claim 1, wherein:
 said first interleaver determines whether or not an interleaving process is performed on a tail bit of an encoded signal input to said first interleaver.

7. The apparatus of claim 1, which further comprises:
 a channel interleaver interleaving an output of said multiplexer.

8. An encoding apparatus for a communication system, comprising:
 a first interleaver interleaving an input signal;
 a first encoder encoding an output from said first interleaver;
 a second encoder encoding the input signal;
 a second interleaver interleaving the input signal and an output from said second encoder; and
 a multiplexer multiplexing outputs from said first encoder and said second interleaver.

9. A method of encoding an input signal for a mobile communication system, said method comprising the steps of:
 (a) encoding the input signal;
 (b) interleaving the input signal together and the signal encoded in said step (a);
 (c) interleaving the input signal;
 (d) encoding a signal obtained in said step (c); and
 (e) multiplexing a signal obtained in said step (b) with another signal obtained in said step (d).

10. The method of claim 9, wherein a turbo-encoding process is performed in said steps (a) and (d).

11. The method of claim 9, wherein a puncturing process is performed on a signal obtained in said step (a) before interleaving the signal in said step (b).

12. The method of claim 9, wherein a puncturing process is performed on a signal obtained in step (d).

13. The method according to claim 9, which further comprises the step of:
 determining whether or not a tail bit of the encoded signal is to be interleaved.

14. The method according to claim 9, further comprising the step of:
 interleaving the multiplexed signal obtained in said step (e).

* * * * *